US 6,552,322 B1

(12) United States Patent
Campbell et al.

(10) Patent No.: US 6,552,322 B1
(45) Date of Patent: Apr. 22, 2003

(54) SHARED PHOTODETECTOR PIXEL IMAGE SENSOR

(75) Inventors: Scott Patrick Campbell, Sunland, CA (US); Eric R. Fossum, La Crescenta, CA (US)

(73) Assignee: Micron Technology, Inc., Boise, ID (US)

( * ) Notice: Subject to any disclaimer, the term of this patent is extended or adjusted under 35 U.S.C. 154(b) by 80 days.

(21) Appl. No.: 09/681,639

(22) Filed: May 15, 2001

Related U.S. Application Data

(60) Provisional application No. 60/204,370, filed on May 16, 2000.

(51) Int. Cl.⁷ .............................................. H01L 27/00
(52) U.S. Cl. .................................. 250/208.1; 250/214 R
(58) Field of Search .......................... 250/208.1, 214 R, 250/214 LS, 214 SW; 257/290, 291, 440; 348/308–310

(56) References Cited

U.S. PATENT DOCUMENTS 6,160,281 A * 12/2000 Guidash ...................... 257/292

* cited by examiner

*Primary Examiner*—Que T. Le
(74) *Attorney, Agent, or Firm*—Dickstein Shapiro Morin & Oshinsky LLP

(57) ABSTRACT

A shared photodetector active pixel sensor uses a single photodetector between two different active pixels. The photodetector has a number of connection portions, which allow connecting to the different photodetector portions.

43 Claims, 2 Drawing Sheets

SHARED PHOTODETECTOR PIXEL IMAGE SENSOR

CROSS REFERENCE TO RELATED APPLICATIONS

This application claims the benefit of the U.S. Provisional Application No. 60/204,370, filed May 16, 2000.

BACKGROUND OF INVENTION

Active pixel sensors and other image sensors often have a trade-off between size of pixels in the sensor and the abilities of the sensor. More pixels may be more desirable, since it may enable the system to acquire light with a higher resolution. However, more pixels can only be added by either increasing the size of the substrate on which the pixels are located, or by reducing the size of the pixels themselves. In order to accommodate this trade-off, it may become important that the pixels be efficiently placed on the substrate. The fill factor refers to the way in which the pixels are placed on the substrate.

Different pixel arrangements may have advantages in different situations. For example, active pixel sensors may be used for image acquisition, moving picture acquisition in either interlaced or non-interlaced format, and/or in freeze frame operations.

SUMMARY OF INVENTION

The present application teaches dual use of photodetectors on a substrate. Photodetectors often accounts for one of the largest real estate use on the pixel substrate. In an embodiment, a plurality of the photodetectors are associated with structure that allows the single photodetector to be used with several different pixels.

BRIEF DESCRIPTION OF DRAWINGS

These and other aspects of the invention will be described in detail with reference to the accompanying drawings, wherein.

DETAILED DESCRIPTION

The present inventors recognized that the photodetector on an image sensor chip, such as an active pixel sensor, often takes up a large amount of area/real estate on the chip. In order to lower the fill factor in certain image sensors such as a freeze frame image sensor, the present system defines a device that shares a single photodetector among several pixels.

Figure 1:
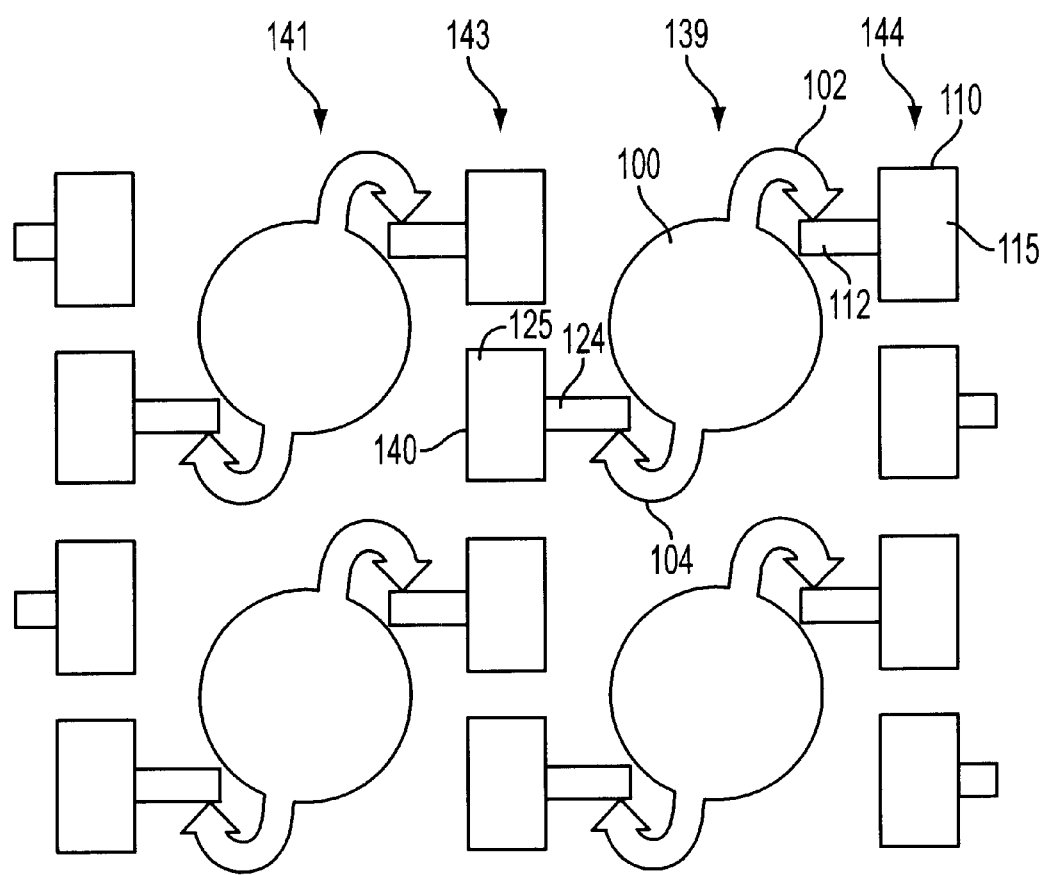
FIG. 1 shows a basic diagram of a shared photodetector active pixel sensor.

An embodiment is shown in FIG. 1. FIG. 1 shows four different photodetectors. Each photodetector such as 100 is shared between two different pixels.

At a first time, photodetector 100 accumulates signal representative of information for pixel 110. At a second time, photodetector accumulates signal for pixel 140. The photodetector 100 includes a first drain path 102 and a second drain path 104, both of which may always have the signal output thereon. A connection to the first drain path 102 provides the photodetector output to a first pixel 110. The connection includes a switch part 112 and a storage cell 115. The switch is activated two coupled to signal from drain path 102 to the storage cell 115.

The second drain path 104 analogously includes a switch 124 leading between the second drain path 104, and a second storage cell 125 for a second pixel 140. Hence, the same photodetector 100 provides outputs indicative of incoming light to the two different pixels 110, 140.

Light is continuously incident on the photodetector 100, and the outputs may continuously provide electrical or other signals indicative of the incident light. The photodetector 100 can be any conventional kind of photodetector including, but not limited to, a photodiode or photogate. The effect of the light on the photodetector is represented by the output signal from the photodetector.

This output signal is only sent to the corresponding storage cell when the appropriate switch 112, 124 is active. That is, the light induced signal is sent to storage cell 115 when the switch 112 is activated. The light induced signal is sent to storage cell 125 when the switch 124 is active. The light induced signal typically may be a signal indicative of the intensity of the light received in the photodetector 100.

After coupling the light intensity proportional signal to the storage cell, e.g. 115, the switch 112 is disconnected. The photodetector can subsequently be coupled via switch 124 to storage cell 125. In this way, several storage cells 115, 125 can become effective pixels in the sensor array, both obtaining their signals from a single photodetector 100.

While the above embodiment has disclosed each photodetector being coupled to two different sites, it should be understood that the photodetector could be coupled to multiple different sites e.g. four different sites for example.

The layout of the cell may be generally as shown in FIG. 1. The photodetectors may be arranged in rows 139, 141, with each photodetector communicating with two different storage cells on opposite sides of the photodetector. The storage cells may also be generally arranged in straight-line rows 143, 144. Each cell may be located between a row of pixels; for example row 143 is located between the rows 139, 141. In addition, the rose may be substantially parallel, so that the line 139 defining the row of photodetectors may be substantially parallel to the line 143 defining the row of storage cells.

Alternatively, the storage cells may surround the pixel in any desired way.

Figure 2:
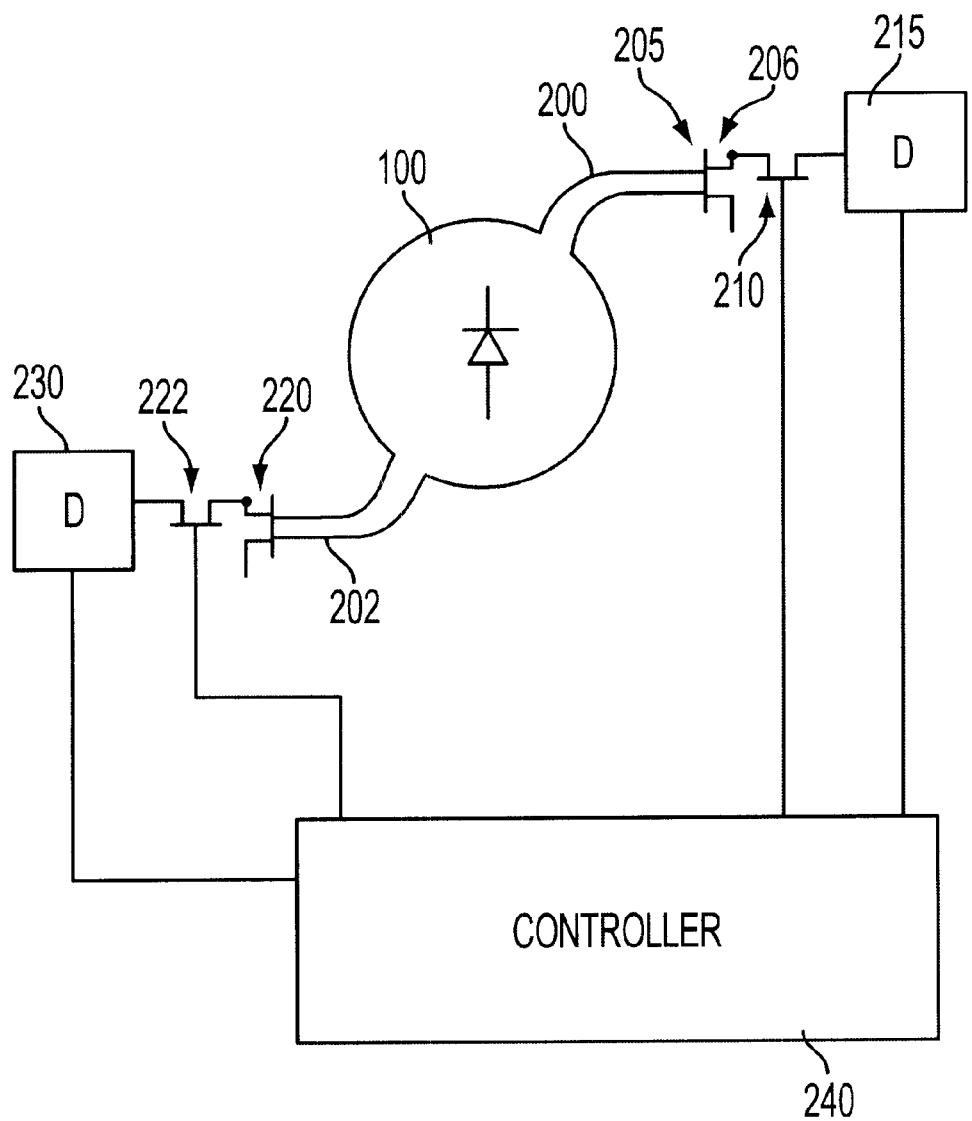
FIG. 2 shows a more detailed diagram of a single photodetector and its connection to two different acquisition sites.

A more detailed diagram of a single pixel is shown in FIG. 2. The photodetector 100, here shown as a photodiode, is shown as being generally round in outer cross-section. However, other shapes may be used to accommodate desired layouts, fill factors, and capacitance issues. The edge portions 200, 202 of the photodetector may taper to a narrower portion 200, 202. The narrower portion is connected to the switching arrangement. For example, the narrower portion 200 connects to a pixel follower 205 which may be a transistor arranged as a follower. The output 206 is connected through a switching transistor 210. The switching transistor 210, when operated, couples its signal through to a storage cell 215. Analogously, the other output from the other end 202 is coupled through a follower 220, to an in line-switching transistor 222, and to the other drain 230.

The overall operation is controlled by a controller 240. Controller 240 includes outputs which may sample the values of drains 215, and may control the switching to the transistors 210, 222. In operation, the controller 240 may control first reading the reset levels of the storage cells 215, 230. Then, the switch 210 may be turned on to cause the light intensity-indicative signal to be transferred to the storage cell 215. The storage cell 215 may then be sampled again. During the time of sampling of the storage cell 215, or some time thereafter, switch 222 may be turned on to transfer charge to storage cell 230. Storage cell 230 may then be sampled.

The above has described an operation which is sequential in time. In this sequential operation, the two switches 210, 222 are never turned on the same time. However, alternatively, the operation may be parallel, with both pixels receiving the information at the same time. In this case, the two switches 210, 222 may be turned on at the same time.

This approach may improve the pixel's effective fill factor, leaving more area for the photodetector and hence creating a more light sensitive pixel geometry. This system may be well suited for freeze frame and/or interlaced pixels. This system may also allow for a non-spatially shifted image claim sampling.

The above has described operation in the context of an active pixel sensor. An active pixel sensor of the preferred embodiment may be a sensor which has all of its elements formed of MOS technology, e.g. photodetector portions formed of MOS, and control portions formed of CMOS. It should be understood that this architecture may be usable in other systems also, such as in a passive pixel sensor or a CCD. Special advantages, however, may be obtained in active pixel sensor, since more circuitry can be formed on the substrate itself.

Although only a few embodiments have been disclosed in detail above, other modifications are possible. For example, while the above describes connection of the photodetector to two different pixels, other numbers of pixels, including 3,4,5 or more different numbers of pixels could be connected to a single photodetector, using respective switching devices. In addition, the controller may control other operations of the image sensor. For example, the controller may control the times during which the photodetector is actually integrating light.

What is claimed is:

1. An image sensor, comprising:
    a photodetector element producing a light indicative signal based on incoming light, said photodetector element having a first connection part at a first location, and a second connection part at a second location, different than said first location;
    a first storage cell;
    a second storage cell, separated from said first storage cell;
    a first switching element, connected between said first connection part of said photodetector element and said first storage cell, and having a first closed state in which a light indicative signal from said photodetector element is passed to said first storage cell, and a second opened state in which a light indicative signal from said photodetector element is blocked from passing to said first storage cell; and
    a second switching element, connected between said second connection part of said photodetector element and said second storage cell, and having a first closed state in which a light indicative signal from said photodetector element is passed to said second storage cell, and a second opened state in which a light indicative signal from said photodetector element is blocked from passing to said second storage cell.

2. A sensor as in claim 1, further comprising a controller, controlling said first and second switching elements between said opened and closed states respectively.

3. A sensor as in claim 1, wherein said controller controls said first and second switching elements sequentially, such that said first and second switching elements are never opened at the same time.

4. A sensor as in claim 1, wherein said photodetector element is a photodiode.

5. A sensor as in claim 1, further comprising a follower transistor, connected between said photodetector element and said first storage cell, and operating to buffer the light indicative signal.

6. A sensor as in claim 2, wherein said controller controls said open and closed states of said first and second switching elements to control reading signals from said first and second storage cells.

7. A sensor as in claim 6, wherein said controller controls said reading in a way which reads a reset level, and then reads a signal level to produce an output indicative of a difference between said reset level and said signal level.

8. A sensor as in claim 2, wherein said controller is formed of CMOS transistors.

9. A sensor as in claim 1, wherein said photodetector element is formed of MOS transistors.

10. A sensor as in claim 1, wherein said first and second storage cells are respectively located on opposite sides of said photodetector element.

11. A sensor as in claim 1, wherein said photodetector element is located on a semiconductor substrate, and wherein said first storage cell, said second storage cell, said first switching element, said second switching element are each located on the same said semiconductor substrate.

12. A sensor as in claim 11, further comprising a controller, also located on said same semiconductor substrate controlling said first and second switching elements between said opened and closed states respectively.

13. A sensor as in claim 1, wherein said photodetector element includes a photo gate.

14. A sensor as in claim 1, wherein said photodetector element has a round outer shape over a portion thereof, and at least first and second narrowed portions, located near said first and second connection parts.

15. A sensor as in claim 7, wherein said reset level is read first, and said signal level is then subtracted from said reset level.

16. A sensor as in claim 11, further comprising first and second follower elements, said first follower element connected to said first connection part, and said second follower element connected to said second connection part.

17. A sensor as in claim 16, wherein said first and second follower elements are connected between the respective connection part, and the respective switching element.

18. A sensor as in claim 11, further comprising a plurality of additional photodetector elements, each said additional photodetector element associated with at least two storage cells, and wherein said photodetector elements arranged in a first line on said semiconductor substrate, and said storage cells are arranged in a second line on said semiconductor substrate which is substantially parallel to said first line on said semiconductor substrate.

19. A method, comprising:
    integrating incoming light in a photodetector element to form a light-indicative signal;
    first coupling said light indicative signal to a first storage cell that is coupled to said photodetector element in a first coupling location; and
    second coupling said light indicative signal to a second storage cell that is coupled to said photodetector element in a second coupling location different than said first coupling location.

20. A method as in claim 19, wherein said first coupling and said second coupling occur at different times.

21. A method as in claim 19, wherein said first coupling and said second coupling occur at overlapping times.

22. A method as in claim 19, further comprising controlling a readout element and reading information from said first and second storage cells.

23. A method as in claim 22, wherein said reading comprises reading both a signal level and a reset level of said storage cells.

24. A method as in claim 23, wherein said reset level is read first, said storage level is read second, and a difference between said storage level and said reset level is determined as an output signal indicative of a pixel value.

25. A method as in claim 19, further comprising buffering output signals from said first and second coupling locations.

26. An image sensor, comprising:

a semiconductor substrate;

a plurality of photodetectors, arranged on said semiconductor substrate, each of said photodetectors having at least first and second connection parts;

a plurality of pixel units, arranged on said semiconductor substrate, and connected such that each photodetector is connected to at least two of said pixel units; and a controller, on said substrate, and controlling a readout operation of said photodetectors to said pixel units.

27. An image sensor as in claim 26, wherein a first group of said photodetectors are arranged in a first line on said semiconductor substrate, and a first group of said pixel units are arranged in a second line on said semiconductor substrate.

28. An image sensor as in claim 27, wherein said first and second lines are substantially parallel.

29. An image sensor as in claim 27, further comprising a second group of said pixel units which are arranged in a third line on said semiconductor substrate.

30. An image sensor as in claim 29, wherein said first, second and third lines do not intersect.

31. An image sensor as in claim 29, wherein said first, second and third lines are substantially parallel to one another.

32. An image sensor as in claim 26, further comprising a plurality of switching elements, respectively connected to said connection parts, and switching a signal between said connection parts and a pixel unit.

33. An image sensor as in claim 32, further comprising a buffering element, formed of a follower transistor, connected between said connection parts and said switching elements.

34. An image sensor as in claim 32, wherein said controller controls a switching state of said switching elements.

35. An image sensor as in claim 34, wherein said controller controls said switching states such that only one of said connection parts on any one photodetector is being sampled at any one time.

36. An image sensor as in claim 34, wherein said controller controls said switching states such that multiple ones of said connection parts on any one photodetector may be sampled at any one time.

37. An image sensor as in claim 34, wherein said controller controls reading levels from said photodetectors.

38. An image sensor as in claim 37, wherein said controller reads both a reset level and a signal level from each photodetector that each time of reading.

39. An image sensor as in claim 37, wherein said controller controls a time of integration of said photodetectors.

40. An image sensor as in claim 26, wherein said controller is formed of transistors formed using CMOS technology.

41. An image sensor as in claim 26, wherein said all of the transistors forming said image sensor are MOS transistors.

42. An image sensor as in claim 26, wherein said photodetector has a substantially round outer shape, with a tapered portion in an area of a connection portion.

43. An image sensor as in claim 26, wherein said photodetector includes a photodiode.

* * * * *

UNITED STATES PATENT AND TRADEMARK OFFICE
CERTIFICATE OF CORRECTION

PATENT NO.    : 6,552,322 B1
DATED         : April 22, 2003
INVENTOR(S)   : Scott P. Campbell et al.

It is certified that error appears in the above-identified patent and that said Letters Patent is hereby corrected as shown below:

Column 1,
Line 30, "accounts" has been changed to -- account --

Column 2,
Line 35, "rose" has been changed to -- rows --

Column 6,
Line 22, "that" has been deleted.

Signed and Sealed this

Twenty-seventh Day of January, 2004

JON W. DUDAS
*Acting Director of the United States Patent and Trademark Office*